(12) United States Patent
Yamazaki et al.

(10) Patent No.: US 6,218,702 B1
(45) Date of Patent: *Apr. 17, 2001

(54) MICROCRYSTAL SILICON FILM AND ITS MANUFACTURING METHOD, AND PHOTOELECTRIC CONVERSION DEVICE AND ITS MANUFACTURING METHOD

(75) Inventors: Shunpei Yamazaki, Tokyo; Yasuyuki Arai, Kanagawa, both of (JP)

(73) Assignee: Semiconductor Energy Laboratory, Co. Ltd. (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/144,584

(22) Filed: Aug. 31, 1998

Related U.S. Application Data

(62) Division of application No. 08/762,665, filed on Dec. 9, 1996, now abandoned.

(30) Foreign Application Priority Data

Dec. 9, 1995 (JP) .................................................. 7-345630

(51) Int. Cl.[7] .................................................. H01L 29/00
(52) U.S. Cl. .............................. 257/347; 257/50; 257/51; 257/63; 257/64; 257/65; 257/66; 257/70; 257/71; 257/72; 257/73; 257/74
(58) Field of Search .................................. 438/162, 166, 438/308, 487; 257/63–66, 70, 74, 50, 51, 347

(56) References Cited

U.S. PATENT DOCUMENTS

| | | | |
|---|---|---|---|
| 5,091,334 | | 2/1992 | Yamazaki et al. .................... 437/101 |
| 5,120,394 | * | 6/1992 | Mukai .................................. 156/610 |
| 5,302,230 | * | 4/1994 | Ino ...................................... 156/603 |
| 5,403,772 | | 4/1995 | Zhang et al. ......................... 437/101 |
| 5,426,064 | | 6/1995 | Zhang et al. ........................... 437/40 |
| 5,481,121 | | 1/1996 | Zhang et al. ........................... 257/64 |
| 5,488,000 | | 1/1996 | Zhang et al. ........................... 437/21 |
| 5,492,843 | | 2/1996 | Adachi et al. ......................... 437/21 |
| 5,501,989 | * | 3/1996 | Takayama ............................. 437/21 |
| 5,508,533 | | 4/1996 | Takemura ............................. 257/64 |
| 5,529,937 | | 6/1996 | Zhang et al. ........................... 437/10 |
| 5,530,265 | * | 6/1996 | Takemura ............................. 257/66 |
| 5,534,716 | | 7/1996 | Takemura ............................. 257/72 |

(List continued on next page.)

FOREIGN PATENT DOCUMENTS

57-13777  1/1982  (JP) .

OTHER PUBLICATIONS

"Low Temperature Selective Crystallization of Amorphous Silicon" Kakkad, *Journal of Non–Crystalline Solids*, vol. 115, 1989, p. 66–68, 1989.*

*Primary Examiner*—Fetsum Abraham
(74) *Attorney, Agent, or Firm*—Fish & Richardson PC

(57) ABSTRACT

A microcrystal silicon film is formed on a substrate by using a silicide gas, a hydrogen gas, and a source gas that enables introduction of a metal element for accelerating crystallization of silicon in a capacitance-coupling plasma CVD apparatus. The action of the metal element provides a high film forming rate. Therefore, a technique for forming a microcrystal silicon film with high quality and high film forming rate can be provided.

49 Claims, 3 Drawing Sheets

U.S. PATENT DOCUMENTS

| | | | |
|---|---|---|---|
| 5,543,352 * | 8/1996 | Ohtani et al. | 257/66 |
| 5,563,426 | 10/1996 | Zhang et al. | 257/66 |
| 5,569,610 | 10/1996 | Zhang et al. | 437/21 |
| 5,569,936 | 10/1996 | Zhang et al. | 257/66 |
| 5,580,792 | 12/1996 | Zhang et al. | 437/10 |
| 5,585,291 | 12/1996 | Ohtani et al. | 437/40 |
| 5,589,694 | 12/1996 | Takayama et al. | 257/67 |
| 5,595,923 | 1/1997 | Zhang et al. | 437/41 |
| 5,595,944 | 1/1997 | Zhang et al. | 437/41 |
| 5,604,360 | 2/1997 | Zhang et al. | 257/72 |
| 5,605,846 | 2/1997 | Ohtani et al. | 437/21 |
| 5,606,179 | 2/1997 | Yamazaki et al. | 257/59 |
| 5,608,232 | 3/1997 | Yamazaki et al. | 257/66 |
| 5,612,250 | 3/1997 | Ohtani et al. | 437/101 |
| 5,614,426 | 3/1997 | Funada et al. | 437/40 |
| 5,614,733 | 3/1997 | Zhang et al. | 257/66 |
| 5,616,506 | 4/1997 | Takemura | 438/150 |
| 5,620,910 | 4/1997 | Teramoto | 438/151 |
| 5,621,224 | 4/1997 | Yamazaki et al. | 257/66 |
| 5,624,851 | 4/1997 | Takayama et al. | 438/166 |
| 5,637,515 | 6/1997 | Takemura | 438/162 |
| 5,639,698 | 6/1997 | Yamazaki et al. | 437/228 |
| 5,643,826 | 7/1997 | Ohtani et al. | 437/88 |
| 5,646,424 | 7/1997 | Zhang et al. | 257/66 |
| 5,654,203 | 8/1997 | Ohtani et al. | 438/97 |
| 5,656,825 | 8/1997 | Kusumoto et al. | 257/66 |
| 5,663,077 | 9/1997 | Adachi et al. | 438/151 |
| 5,677,549 | 10/1997 | Takayama et al. | 257/66 |
| 5,696,386 | 12/1997 | Yamazaki | 257/57 |
| 5,696,388 | 12/1997 | Funada et al. | 257/64 |
| 5,700,333 | 12/1997 | Yamazaki et al. | 136/258 |
| 5,705,829 | 1/1998 | Miyanaga et al. | 257/66 |
| 5,712,191 | 1/1998 | Nakajima et al. | 437/174 |
| 5,744,824 | 4/1998 | Kousai et al. | 257/74 |

* cited by examiner

MICROCRYSTAL SILICON FILM AND ITS MANUFACTURING METHOD, AND PHOTOELECTRIC CONVERSION DEVICE AND ITS MANUFACTURING METHOD

This is a divisional of U.S. application Ser. No. 08/762,665, filed Dec. 9, 1996 abandoned.

BACKGROUND OF THE INVENTION

1. Field of the Invention

The present invention relates to a microcrystal silicon film used as a component of a solar cell and a thin-film transistor, and to a manufacturing method of such a microcrystal silicon film.

2. Description of the Related Art

Microcrystal silicon is known as a material which exhibits intermediate properties between amorphous silicon and single crystal silicon. As is known from Japanese Examined Patent Publication No. Hei. 3-8102 and Japanese Unexamined Patent Publication No. Sho. 57-67020, a plasma CVD method is known as a manufacturing method of a microcrystal silicon film. In this method, a microcrystal silicon film is deposited on a substrate by decomposing a mixed gas of a silane gas and a hydrogen gas by glow discharge. This method is characterized in that the mixed gas that is supplied to a reaction space for forming a film should be composed such that the amount of hydrogen gas is tens to hundreds of times larger than the amount of silane gas, and in that glow discharge is caused by inputting electric power at a high density. Further, if a diborane gas, a phosphine gas, or the like is added to the above mixed gas for the purpose of valence electron control, doping is effected so efficiently that there can be obtained a high electric conductivity which cannot be attained by an amorphous silicon film. For this reason, a microcrystal silicon film is frequently used as a valence-electron-controlled doped layer, i.e., a p-type or n-type layer to constitute a photocell or a thin-film transistor.

In manufacture of a microcrystal silicon film in which a silane material gas is diluted, the film forming rate is substantially determined by the silane gas supply amount and is lower than that of an amorphous silicon film. The film forming rate of a microcrystal silicon film is approximately in a range of 0.01–0.1 nm/s. A film forming rate lower than this range is not practical, whereas a microcrystal silicon film is not formed at a film forming rate higher than this range.

To increase the film forming rate, techniques for increasing the density of a silane gas or the input discharge power would be conceivable. However, the range of conditions which allows successful formation of a microcrystal silicon film is restricted; under the conditions out of that range, the crystal grain diameter of a film formed becomes too small, and reduction in crystal density prevents formation of a high-quality microcrystal silicon film.

The valence electron control of a microcrystal silicon film can be performed to obtain a film of p-type or n-type conductivity by adding an impurity during the film formation by using a doping gas of diborane, phosphine, or the like. It is an empirical fact that the addition of diborane, among those doping gases, particularly makes it difficult to effect microcrystallization.

The microcrystal silicon film is applied to the solar cell to form a p-type or n-type layer. To reduce the light absorption loss those layers are made as thin as about 10–50 nm at most. However, in forming such a thin microcrystal silicon film, the interaction with an undercoat material prevents sufficient microcrystallization.

For example, in forming a solar cell having a PIN junction, a heterojunction is formed by depositing a p-type layer of about 10 nm in thickness on an i-type amorphous silicon film. However, the deposition of a microcrystal film on an amorphous film causes lattice distortion, so that sufficient microcrystallization is not effected at the initial stage of the deposition and amorphous components become dominant in the corresponding region of a film formed. Thus, microcrystal silicon layers of solar cells formed according to the conventional techniques not necessarily have sufficient characteristics.

Although it is possible to produce a solar cell in which the entire PIN junction is made of microcrystal silicon, in this case the thickness of the i-type layer should be about 1,000 nm or preferably more than 1,000 nm due to the optical properties of the microcrystal silicon films. However, since the film forming rate of a microcrystalline silicon film is low, this type of configuration is not practical. For example, under film forming conditions for 0.03 nm/s, which is a typical film forming rate of a microcrystal silicon film, it takes more than 9 hours to deposit a 1,000-nm-thick film. This kind of process is extremely low in practicality.

SUMMARY OF THE INVENTION

An object of the present invention is therefore to form a high-quality microcrystal silicon film that is superior in crystallinity while increasing its film forming rate.

Another object of the invention is to form a microcrystal silicon film that is superior in crystallinity in thin-film devices such as a thin-film transistor or as a p-type or n-type layer of a solar cell.

To attain the above objects, according to the invention, to form a microcrystal silicon film that is better in quality than conventional microcrystal silicon films by using the conventional plasma CVD as a basis, a metal element for accelerating crystallization of silicon is added during the film formation as a means for accelerating microcrystallization of the film.

The metal element may be one or a plurality of elements selected from the group consisting of Fe, Co, Ni, Ru, Rh, Pd, Os, Ir, Pt, Cu, and Au. In particular, very favorable results can be obtained by using Ni due to its large effects and high reproducibility.

The use of the above-described metal element facilitates microcrystallization and improves the film forming rate. As a result, a high-quality microcrystal silicon film having superior crystallinity can be obtained even if it is as thin as about 10 nm.

Where nickel is used as the metal element, nickel is introduced into a deposited film by adding, to material gases, a gas of a compound including nickel as a main constituent by using the conventional plasma CVD technique as a basis. It is proper that the nickel concentration be $5 \times 10^{16}$ to $5 \times 10^{19}$ $cm^{-3}$. No marked effects are observed if the nickel concentration is lower than this range, and the film characteristics become worse if it is higher than the above range.

Another method of adding nickel to a film is such that by likewise using the conventional plasma CVD technique as a basis, a nickel filament is disposed in a glow discharge space and heated during the film formation.

The invention can be applied not only to a solar cell but also, in principle, to photoelectric conversion devices, such as a photosensor, having similar functions as typified by the function of converting light to electrical energy.

If a metal element for accelerating microcrystallization of silicon is added to reaction gases during deposition of a microcrystal silicon film by plasma CVD, the metal element serves as nuclei of crystal growth, thereby facilitating the microcrystallization as compared to the case of not adding the metal element. The microcrystallization occurs from the initial stage where a film being deposited is still very thin. With the metal element serving as nuclei of crystal growth, the film forming rate of a microcrystal silicon film can be increased easily.

As for the electrical characteristics of a film, a film having improved crystallinity can be effectively doped in performing valence electron control to obtain, for instance, p-type or n-type conductivity, whereby the film is given a lower resistance than in the conventional case. Further, electrical characteristics equivalent to those of a conventional film can be attained even with a thinner film.

The above features are advantageous in a microcrystal silicon film that is used as a p-type or n-type layer of a solar cell. These layers are usually formed at a thickness of 10 to 50 nm at least, but the conventional techniques cannot provide a sufficiently high degree of crystallinity in such a thickness range. In contrast, the manufacturing method of the invention greatly improves the crystallinity. With this advantage, a p-type or n-type microcrystal silicon layer that is formed on the light-incidence-side of a solar cell can be made sufficiently thin.

DETAILED DESCRIPTION OF THE PREFERRED EMBODIMENTS

Embodiment 1

This embodiment is directed to a case of forming a microcrystal silicon film on a glass substrate. In this embodiment, as shown in FIG. 1, a conventional capacitive-coupling plasma CVD apparatus is utilized for forming a microcrystal silicon film.

It is also possible to use inductive-coupling apparatuses, microwave CVD apparatuses, and ECR-CVD apparatuses as an apparatus for forming a microcrystal silicon film.

Figure 1:
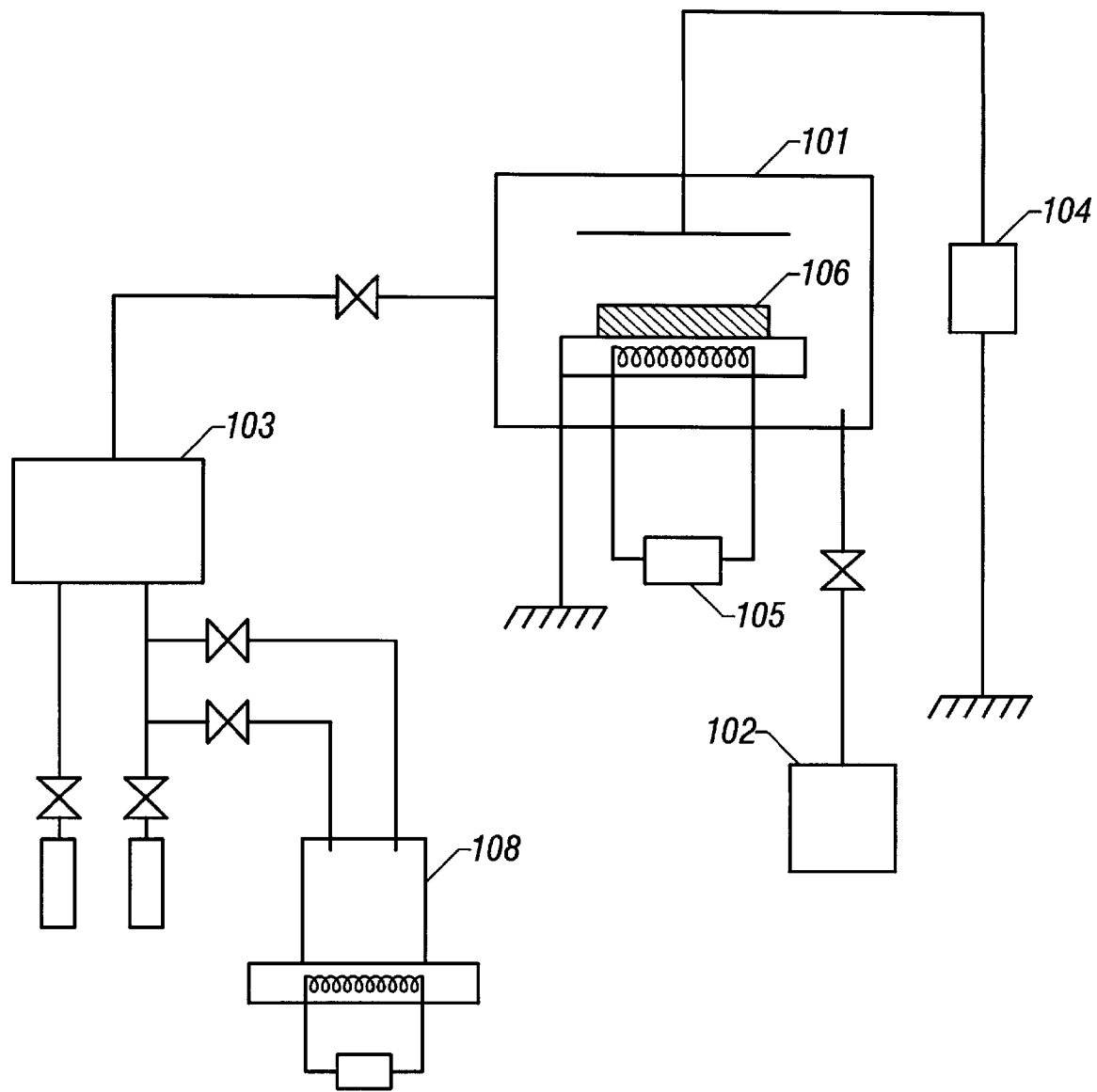
FIG. 1 shows a plasma CVD apparatus used in a first embodiment of the present invention.

The plasma CVD apparatus of FIG. 1 is equipped with a reaction chamber 101, an evacuation means 102, a gas supply means 103, a source 108 of supplying a metal element for accelerating crystallization of silicon, a glow discharge generating means (high-frequency power supply) 104, and a substrate heating means (heater power supply) 105. A substrate 106 is placed on the anode electrode side of the glow discharge generating means 104, and is heated by the substrate heating means 105 to the room temperature to 300° C.

A high-frequency power of 13.56 MHz is usually supplied from the glow discharge generating means 104. However, the frequency may be higher than the above value.

A mixed gas of a silane gas, a hydrogen gas, and a nickel (metal element as mentioned above) source gas is used to form a microcrystal silicon film. Bis (methylcyclopentadienyl)nickel (hereinafter abbreviated as Bis-Ni) is used to constitute the nickel source gas. A disilane gas, a silicon tetrafluoride gas, or the like may be used instead of the silane gas. It is also possible to form a p-type or n-type microcrystal silicon film by adding a diborane or phosphine gas.

A process usually performed to conduct plasma CVD, which process includes evacuation, substrate heating, supply of a material gas, and glow discharge, can be applied to the formation of a microcrystal silicon film.

Bis-Ni is accommodated in a dedicated container, and is heated to about 40° C. to supply it to the reaction chamber 101. In this state, the saturated vapor pressure of Bis-Ni is about 0.05 mmHg. To control the supply amount of Bis-Ni to the reaction chamber 101, a hydrogen carrier gas is used and its pressure in the container is set at 2 kgf/cm$^2$. The mixed gas is supplied to the reaction chamber 101 via a mass flow controller.

A Corning 7059 glass substrate is used as the substrate 106 on which a film is to be deposited. The substrate 106 is placed on the grounded anode electrode. The substrate temperature is set at 80°–300° C., preferably 100°–160° C., during the film formation.

If the substrate temperature is about 100° C. or lower, it is possible to use a substrate made of a resin material such as a PET film, in which case a microcrystal silicon film of the invention can be formed on a resin material substrate.

As for the reaction gases, a pure hydrogen gas, a hydrogen gas mixed with a Bis-Ni vapor, and a silane gas are introduced at 100 sccm, 100 sccm, and 5 sccm, respectively. The pressure of the reaction space is kept at 0.1 Torr.

P-type or n-type doping can be performed by adding a diborane or phosphine gas to the silane gas at 0.2–5%. Discharge is effected by inputting a power of 50 W by using a high-frequency power supply of 13.56 MHz, which is used ordinarily.

A 500-nm-thick film is obtained by continuing discharge for 90 minutes. This means that a film forming rate is 0.12 nm/s, which is 2 to 5 times higher than in the conventional process.

Microcrystal silicon films formed according to the above process were subjected to a Raman spectroscopic measurement to check their crystallinity. Two peaks were observed at 520 cm$^{-1}$ and 480 cm$^{-1}$, which correspond to crystal silicon and amorphous silicon respectively. Thus, it was confirmed that microcrystal silicon films were formed.

The level of crystallinity can be determined by comparing the two peak intensities. An intensity ratio of 10:1 was obtained by the process of this embodiment. For comparison, microcrystal silicon films were also formed by the conventional film forming process, in which the intensity ratio was 2:1 to 7:1 (best case).

Further, the concentration of nickel introduced in films was measured by secondary ion mass spectrometry. A nickel concentration value of 8×10$^{17}$ cm$^{-3}$ was obtained.

It is preferred that the nickel concentration in a film be 5×10$^{16}$ to 5×10$^{19}$ cm$^{-3}$. If the concentration is higher than this range. the microcrystallinity of a film becomes worse. At concentration values smaller than the above range, the addition of nickel showed no or only very small effects.

It was also observed that carbon, which was contained in the nickel source gas, was introduced in films at a concentration of 6×10$^{18}$ cm$^{-3}$. This concentration value is as small as two times the value of conventional microcrystal silicon films to which nickel is not added, and therefore does not impair the film characteristics.

This embodiment is directed to the case of forming a microcrystal silicon film on a glass substrate. A microcrystal film formed on a glass substrate can be applied to thin-film devices such as a solar cell and a thin-film transistor.

Embodiment 2

Figure 2:
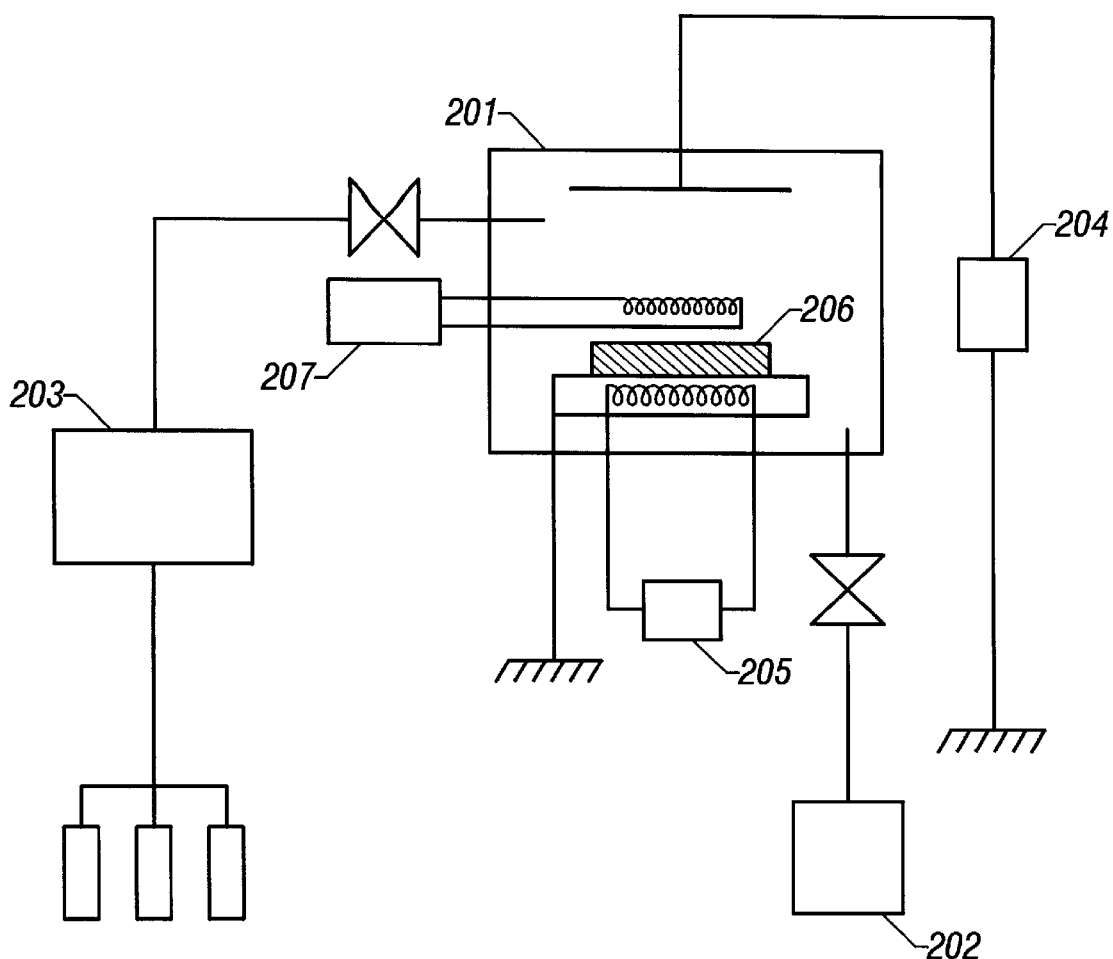
FIG. 2 shows a plasma CVD apparatus used in a second embodiment of the invention.
Figure 3:
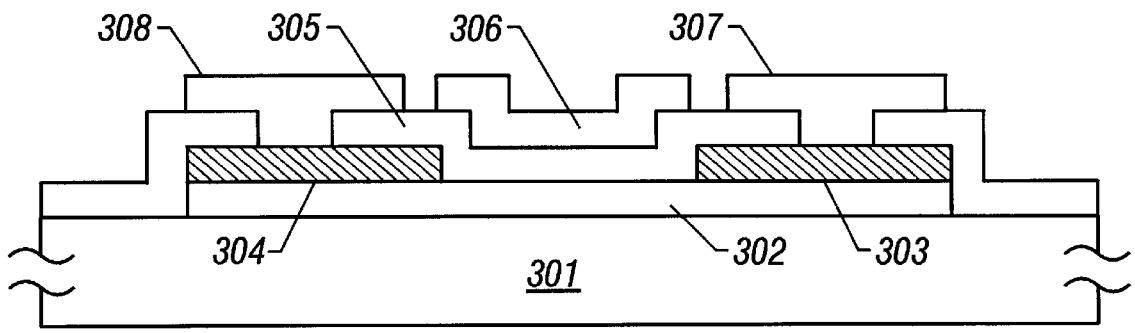
FIG. 3 shows a sectional structure of a thin-film transistor that is formed according to a third embodiment of the invention.

This embodiment is directed to a case where a nickel filament is used to add nickel during formation of a microcrystal silicon film by plasma CVD. FIG. 2 shows the configuration of an apparatus used.

In the apparatus of FIG. 2, a nickel filament is interposed between two electrodes (anode and cathode) of a conventional capacitive-coupling plasma CVD apparatus. During the film formation, the nickel filament is heated by causing a current to flow therethrough, to generate a nickel vapor of a very small amount.

As shown in FIG. 2, the reaction chamber 201 is evacuated by an evacuation means 202 which includes a rotary pump and a turbo-molecular pump. A glass substrate 206 is heated by a substrate heating means 205. Although microcrystal silicon film can be formed with a substrate temperature range of 80°–300° C., the substrate temperature is set at 120° C. in this embodiment.

A hydrogen gas is introduced into the reaction chamber 201 by a gas supply means 203. The reaction pressure is controlled at 0.01–10 Torr, typically 1.0 Torr, by a conductance valve that is attached to the evacuation means 202. The nickel filament 207 is heated in this state by causing a current to flow through it from a power supply. The nickel filament is 1 mm in thickness.

The temperature of the nickel filament is controlled by a current flowing through it while measuring it with a color temperature meter. Since the melting point of nickel is 1,455° C., it is preferred that the temperature of the nickel filament be controlled to be kept lower than 1,455° C., specifically 700°–1,400° C. If the temperature is too low, film deposition occurs on the nickel filament surface, which prevents its long-term use. If the temperature is higher than 1,300° C., film deposition occurs at only a low rate.

It is judged from the above facts that the temperature of the nickel filament should be kept at about 1,350° C. In this state, a film is deposited by causing glow discharge by means of a discharge generating means 204 while a silane gas is introduced into the reaction chamber 201. The silane gas and a hydrogen gas are introduced at 5 sccm and 200 sccm, respectively, while the pressure is controlled at 1.0 Torr. The input discharge power is set at 50 W, and the film forming time is 90 minutes. Thus, a 500-nm-thick film is deposited.

Microcrystal silicon films formed according to the above process were subjected to a Raman spectroscopic measurement to check their crystallinity. Two peaks were observed at 520 cm$^{-1}$ and 480 cm$^{-1}$, which correspond to crystal silicon and amorphous silicon, respectively. The level of crystallinity can be determined by comparing the two peak intensities. An intensity ratio of 10:1 was obtained by the process of this embodiment. For comparison, microcrystal silicon films were also formed by the conventional film forming process, in which the intensity ratio was 2:1 to 7:1 (best case).

Further, the concentration of nickel introduced in films was measured by secondary ion mass spectrometry. A nickel concentration value of $8 \times 10^{17}$ cm$^{-3}$ was obtained. It is preferred that the nickel concentration in a film be $5 \times 10^{16}$ to $5 \times 10^{19}$ cm$^{-3}$. If the concentration is higher than this range, the microcrystallinity of a film becomes worse. At concentration values smaller than the above range, the addition of nickel showed only small effects.

This embodiment, which is directed to the case of forming a microcrystal silicon film on a glass substrate, can also be applied to thin-film devices such as a solar cell and a thin-film transistor.

Embodiment 3

This embodiment is directed to a case where a microcrystal silicon film is applied to a thin-film transistor. Although a top-gate type structure will be described in this embodiment, the invention can apparently be applied to a bottom-gate type structure.

In this embodiment, an inexpensive soda glass substrate is used as a substrate 301 on which a thin-film transistor is to be formed. A 200-nm-thick, i-type amorphous silicon film is formed on the glass substrate 301 by a known plasma CVD method, and then shaped into an island-like layer 302 by photolithography.

Next, an n-type microcrystal silicon film is formed over the entire surface by the method of the first embodiment by using a mixed gas of silane gas, a hydrogen gas, and a source gas of nickel that serves as a catalyst element.

Bis-Ni is used to constitute the nickel source gas. A disilane gas, a silicon tetrafluoride gas, or the like may be used instead of the silane gas. N-type doping is effected by adding phosphine by 1% with respect to silane.

Bis-Ni is accommodated in a dedicated container, and is heated to about 40° C. to supply it to the reaction chamber. In this state, the saturated vapor pressure of Bis-Ni is about 0.05 mmHg. To control the supply amount of Bis-Ni to the reaction chamber, a hydrogen carrier gas is used.

The substrate temperature is set at 80°–300° C., preferably 100°–160° C., during the film formation. As for the reaction gases, a pure hydrogen gas, a hydrogen gas mixed with a Bis-Ni vapor, and a silane gas added with a phosphine gas at 1% are introduced at 100 sccm, 100 sccm, and 5 sccm, respectively. The reaction pressure is kept at 0.1 Torr.

Discharge is effected by inputting a power of 50 W by using a high-frequency power supply of 13.56 MHz, which is used ordinarily. A film is deposited at a thickness of 50 nm. A film thus formed is patterned by photolithography so that only a source region 303 and a drain region 304 are left.

Next, a 100-nm-thick silicon oxide film as a gate insulating film 305 is deposited by sputtering, in which a silicon oxide target of 99.99% purity is used and the substrate temperature is set at 80°–300° C., for instance, 150° C. The sputtering atmosphere is a mixture of oxygen and argon in which a ratio of argon to oxygen is 0 to 0.5, for instance, 0.1 or less.

After contact holes are formed for the source and drain regions 303 and 304, a gate electrode 306, a source electrode 307, and a drain electrode 308 are formed with a metal material such as aluminum or a multi-layer film of aluminum and titanium nitride. Thus, a thin-film transistor is completed.

Embodiment 4

Figure 4:
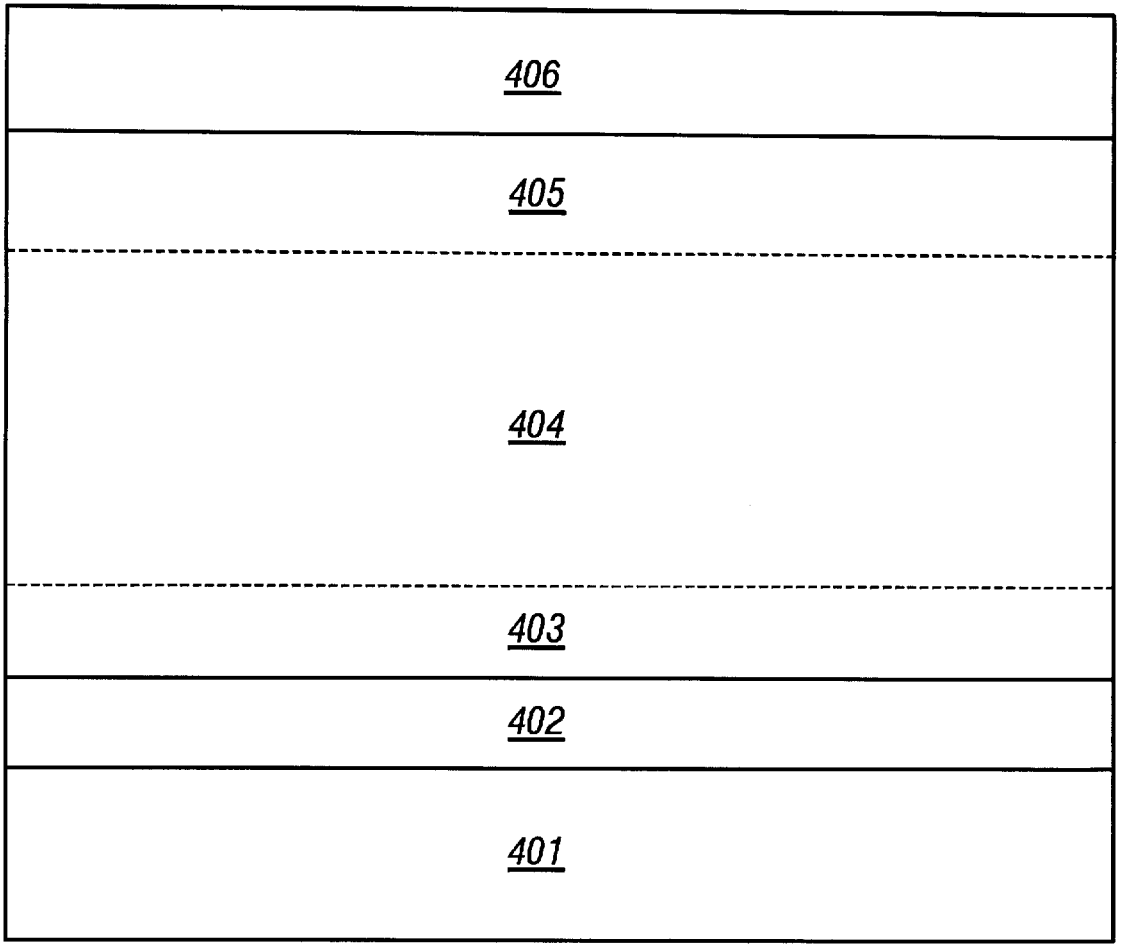
FIG. 4 shows a sectional structure of a solar cell produced according to a fourth or fifth embodiment.

This embodiment is directed to a case where a microcrystal silicon film is applied to a solar cell having a PIN junction. FIG. 4 shows a sectional structure of a solar cell, in which a metal electrode 402, an n-type microcrystal silicon layer 403, an intrinsic or substantially intrinsic amorphous silicon layer 404, a p-type microcrystal silicon layer 405, and a transparent electrode 406 are laminated on a substrate 401.

The substrate 401 may be made of soda glass, a metal plate such as a stainless plate, a plastic film, or the like. It is preferred that the back electrode 402 be made of metal such as aluminum or silver. The back electrode 402 is formed at a thickness of 300 nm. Even superior characteristics can be obtained by forming, on the back metal electrode 402, a several-nanometer-thick metal film of chromium, stainless, zinc oxide, or the like.

The PIN layers are formed by using a conventional plasma CVD apparatus by depositing the n-type microcrystal silicon layer 403 (thickness: 30 nm), the i-type amorphous silicon layer 404 (500 nm), and the p-type microcrystal silicon layer 405 (10 nm) in this order from the metal electrode 402 side. The thicknesses of those layers are not limited to the above specific values.

During the formation of the microcrystal silicon films, nickel as a catalyst element for accelerating microcrystallization is added to gases. To facilitate the addition of nickel, Bis-Ni is used.

Bis-Ni is accommodated in a dedicated container, and is heated to about 40° C. to supply it to the reaction chamber. In this state, the saturated vapor pressure of Bis-Ni is about 0.05 mmHg. To control the supply amount of Bis-Ni to the reaction chamber, a hydrogen carrier gas is used. With the hydrogen pressure in the container set at 2 kgf/cm$^2$, the mixed gas is supplied to the reaction chamber via a mass flow controller.

The substrate temperature is set at 80°–300° C., preferably 100°–160° C., during the film formation. As for the reaction gases, a pure hydrogen gas, a hydrogen gas mixed with a Bis-Ni vapor, and a silane gas added with a diborane gas (for a p-type layer) or a phosphine gas (for an n-type layer) at 1% are introduced at 100 sccm. 100 sccm, and 5 sccm, respectively. The reaction pressure is kept at 1.0 Torr.

Discharge is effected by inputting a power of 50 W by using a high-frequency power supply of 13.56 MHz, which is used ordinarily. An i-type amorphous silicon layer is deposited by using, a pure silane gas under conditions of 1.0 Torr and 20 W. Finally, a 60-nm-thick ITO film is formed by a known sputtering method as the light-incidence-side transparent electrode, to complete a solar cell.

The resulting solar cell having the microcrystal silicon films disclosed in the invention has a higher open-circuit voltage than the conventional solar cell having the same type of configuration. For example, the solar cell according to this embodiment provides an open-circuit voltage of 0.93V, whereas the conventional solar cell does 0.86V. In this case, the conversion efficiency is improved by about 8% as compared to the conventional solar cell.

Embodiment 5

This embodiment is directed to a case where the microcrystal silicon film of the invention is applied to a solar cell having a PIN junction. FIG. 4 shows a sectional structure of a solar cell, in which a metal electrode 402, an n-type microcrystal silicon layer 403, an intrinsic microcrystal silicon layer 404, a p-type microcrystal silicon layer 405, and a transparent electrode 406 are laminated on a substrate 401. The substrate 401 may be made of soda glass, a metal plate such as a stainless plate, a plastic film, or the like.

It is preferred that the back electrode 402 be made of metal such as aluminum or silver. The back electrode 402 is formed at a thickness of 300 nm. Even superior characteristics can be obtained by forming, on the back metal electrode 402, a several-nanometer-thick metal film of chromium, stainless, zinc oxide, or the like.

The PIN layers are formed by using a conventional plasma CVD apparatus by depositing the n-type microcrystal silicon layer 403 (thickness: 30 nm), the i-type microcrystal silicon layer 404 (1,000 nm), and the p-type microcrystal silicon layer 405 (10 nm) in this order from the metal electrode 402 side. The thicknesses of those layers are not limited to the above specific values.

During the formation of the microcrystal silicon films, nickel as a metal element for accelerating microcrystallization is added to gases. To facilitate the addition of nickel, Bis-Ni is used.

Bis-Ni is accommodated in a dedicated container, and is heated to about 40° C. to supply it to the reaction chamber. In this state, the saturated vapor pressure of Bis-Ni is about 0.05 mmHg. To control the supply amount of Bis-Ni to the reaction chamber, a hydrogen carrier gas is used. The substrate temperature is set at 80°–300° C., preferably 100°–160° C., during the film formation. As for the reaction gases, a pure hydrogen gas, a hydrogen gas mixed with a Bis-Ni vapor, and a silane gas added with a diborane gas (for a p-type layer) or a phosphine gas (for an n-type layer) at 1% are introduced at 100 sccm, 100 sccm, and 5 sccm, respectively. The reaction pressure is kept at 1.0 Torr.

Discharge is effected by inputting a power of 50 W by using a high-frequency power supply of 13.56 MHz, which is used ordinarily. Under the above conditions, a film forming rate of 0.12 nm/s is obtained, which is about 3.5 times higher than in the conventional film forming method. As such, the invention can greatly improve the process throughput. Finally, a 60-nm-thick ITO film is formed by a known sputtering method as the light-incidence-side transparent electrode, to complete a solar cell.

As described above, according to the invention, by adding a metal element for accelerating microcrystallization of silicon is added to reaction gases during deposition of a microcrystal silicon film by plasma CVD, the metal element serves as nuclei of crystal growth, thereby facilitating the formation of a microcrystal silicon film as compared to the case of not adding the metal element.

That is, since the metal element serves as nuclei of microcrystal growth, the film forming rate can be made higher than in the conventional film forming methods. With the catalyst element serving as nuclei of microcrystal growth, microcrystallization occurs from the start of film deposition, whereby a high-quality microcrystal film can be obtained even if it is as thin as 10 nm.

The improved microcrystallinity causes improvement in the electrical characteristics of a microcrystal silicon film, and the doping for valence electron control to obtain a film of p-type or n-type conductivity can be performed effectively. Therefore, the film is given a lower resistance than in the conventional case.

Having the above features, the microcrystal silicon film of the invention can improve the characteristics of a solar cell or a thin-film transistor when used as its p-type or n-type layer. For example, the light-incidence-side layer of a solar cell having a PIN junction is required to be as thin as 10 nm, but in such a case the conventional techniques cannot provide a sufficiently high degree of crystallinity and the open circuit voltage is low. In contrast, by using the microcrystal silicon film of the present invention, the microcrystallinity is improved and the open-circuit voltage is increased. With these advantages, the window layer that is formed on the light-incidence-side of a solar cell can be made sufficiently thin.

What is claimed is:

1. A semiconductor device comprising a p-type microcrystalline semiconductor film formed on an amorphous semiconductor film wherein the p-type microcrystalline semiconductor film contains a metal element for accelerating crystallization of said semiconductor at a concentration not higher than $5 \times 10^{19}$ cm$^{-3}$.

2. A semiconductor device comprising a n-type microcrystalline semiconductor film formed on an amorphous semiconductor film wherein the n-type microcrystalline semiconductor film contains a metal element for accelerating crystallization of said semiconductor at a concentration not higher than $5 \times 10^{19}$ cm$^{-3}$.

3. A semiconductor device comprising a PIN-junction including a microcrystalline semiconductor film comprising silicon, said semiconductor film containing a metal element for accelerating crystallization of said semiconductor at a concentration not higher than $5 \times 10^{19}$ cm$^{-3}$, wherein said PIN-junction comprises a p-type microcrystalline semiconductor film, I-type amorphous semiconductor film and n-type microcrystalline semiconductor film.

4. The semiconductor device of claim 1, 2 or 3 wherein the metal element is one or a plurality of elements selected from the group of Fe, Co, Ni, Ru, Rh, Pd, Os, Ir, Pt, Cu and Au.

5. The semiconductor device according to claim 1, 2 or 3 wherein said concentration is not lower than $5 \times 10^{16}$ cm$^{-3}$.

6. The semiconductor device according to claim 1, 2 or 3 wherein said semiconductor device is a photoelectric conversion device.

7. A semiconductor device comprising:

a microcrystalline semiconductor film formed on an amorphous semiconductor film, wherein said microcrystalline semiconductor film contains a metal element at a concentration of $5 \times 10^{16}$ to $5 \times 10^{19}$ cm$^{-3}$.

8. A semiconductor device according to claim 7 wherein said metal element is selected from the group consisting of Fe, Co, Ni, Ru, Rh, Pd, Os, Ir, Pt, Cu and Au.

9. A thin film transistor comprising:

a channel region comprising an amorphous semiconductor film;

source and drain regions comprising a microcrystalline semiconductor film, said microcrystalline semiconductor film containing a metal element for accelerating crystallization of said semiconductor at a concentration not higher than $5 \times 10^{19}$ cm$^{-3}$, wherein said source and drain regions have p-type or n-type conductivity.

10. The thin film transistor of claim 9 wherein said metal element is one or a plurality of elements selected from the group of Fe, Co, Ni, Ru, Rh, Pd, Os, Ir, Pt, Cu and Au.

11. The thin film transistor of claim 9 wherein said concentration is not lower than $5 \times 10^{16}$ cm$^{-3}$.

12. The thin film transistor of claim 9 wherein said microcrystalline semiconductor film exhibits a Raman spectrum which has two peaks at 520 cm$^{-1}$ and 480 cm$^{-1}$.

13. The thin film transistor of claim 9 wherein said thin film transistor is a top-gate type thin film transistor.

14. The thin film transistor of claim 9 wherein said thin film transistor is a bottom-gate type thin film transistor.

15. A thin film transistor comprising:

a channel region comprising an amorphous semiconductor film;

source and drain regions comprising a microcrystalline semiconductor film, said microcrystalline semiconductor film containing a metal element for accelerating crystallization of said semiconductor at a concentration not higher than $5 \times 10^{19}$ cm$^{-3}$, wherein said source and drain regions have p-type or n-type conductivity; and wherein said source and drain regions is in contact with said channel region directly.

16. The thin film transistor of claim 15 wherein said metal element is one or a plurality of elements selected from the group of Fe, Co, Ni, Ru, Rh, Pd, Os, Ir, Pt, Cu and Au.

17. The thin film transistor of claim 15 wherein said concentration is not lower than $5 \times 10^{16}$ cm$^{-3}$.

18. The thin film transistor of claim 15 wherein said microcrystalline semiconductor film exhibits a Raman spectrum which has two peaks at 520 cm$^{-1}$ and 480 cm$^{-1}$.

19. The thin film transistor of claim 15 wherein said thin film transistor is a top-gate type thin film transistor.

20. The thin film transistor of claim 15 wherein said thin film transistor is a bottom-gate type thin film transistor.

21. A thin film transistor comprising:

a channel region comprising an amorphous semiconductor film;

source and drain regions comprising a microcrystalline semiconductor film formed on said channel region, said microcrystalline semiconductor film containing a metal element for accelerating crystallization of said semiconductor at a concentration not higher than $5 \times 10^{19}$ cm$^{-3}$, wherein said source and drain regions have p-type or n-type conductivity; and wherein a thickness of said source and drain regions is not higher than 50 nm.

22. The thin film transistor of claim 21 wherein said metal element is one or a plurality of elements selected from the group of Fe, Co, Ni, Ru, Rh, Pd, Os, Ir, Pt, Cu and Au.

23. The thin film transistor of claim 21 wherein said concentration is not lower than $5 \times 10^{16}$ cm$^{-3}$.

24. The thin film transistor of claim 21 wherein said microcrystalline semiconductor film exhibits a Raman spectrum which has two peaks at 520 cm$^{-1}$ and 480 cm$^{-1}$.

25. The thin film transistor of claim 21 wherein said thin film transistor is a top-gate type thin film transistor.

26. The thin film transistor of claim 21 wherein said thin film transistor is a bottom-gate type thin film transistor.

27. A photoelectric conversion device comprising:

a semiconductor laminate film formed on a substrate having a conductive surface, said semiconductor laminate film comprising a p-type microcrystalline semiconductor film, an I-type amorphous semiconductor film and an n-type microcrystalline semiconductor film collectively defining a PIN-junction, wherein said p-type and n-type microcrystalline semiconductor films contain a metal element for accelerating crystallization thereof at a concentration not higher than $5 \times 10^{19}$ cm$^{-3}$.

28. The photoelectric conversion device of claim 27 wherein said metal element is one or a plurality of elements selected from the group of Fe, Co, Ni, Ru, Rh, Pd, Os, Ir, Pt, Cu and Au.

29. The photoelectric conversion device of claim 27 wherein said concentration is not lower than $5 \times 10^{16}$ cm$^{-3}$.

30. The photoelectric conversion device of claim 27 wherein said p-type and n-type microcrystalline semiconductor films exhibit a Raman spectrum which has two peaks at 520 cm$^{-1}$ and 480 cm$^{-1}$.

31. A photoelectric conversion device comprising:

a semiconductor laminate film formed on a substrate having a conductive surface, said semiconductor laminate film comprising a p-type microcrystalline semiconductor film, an I-type amorphous semiconductor film and an n-type microcrystalline semiconductor film collectively defining a PIN-junction, wherein said p-type or n-type microcrystalline semiconductor films contain a metal element for accelerating crystallization thereof at a concentration not higher than $5 \times 10^{19}$ cm$^{-3}$, and wherein said p-type and n-type microcrystalline semiconductor films are in contact with said I-type microcrystalline semiconductor film directly.

32. The photoelectric conversion device of claim 31 wherein said metal element is one or a plurality of elements selected from the group of Fe, Co, Ni, Ru, Rh, Pd, Os, Ir, Pt, Cu and Au.

33. The photoelectric conversion device of claim 31 wherein said concentration is not lower than $5 \times 10^{16}$ cm$^{-3}$.

34. The photoelectric conversion device of claim 31 wherein said p-type and n-type microcrystalline semiconductor films exhibit a Raman spectrum which has two peaks at 520 cm$^{-1}$ and 480 cm$^{-1}$.

35. A photoelectric conversion device comprising:

a semiconductor laminate film formed on a substrate having a conductive surface, said semiconductor laminate film comprising a p-type microcrystalline semiconductor film, an I-type amorphous semiconductor film and an n-type microcrystalline semiconductor film collectively defining a PIN-junction, wherein said p-type and n-type microcrystalline semiconductor films contain a metal element for accelerating crystallization thereof at a concentration not higher than $5 \times 10^{19}$ cm$^{-3}$, and wherein a thickness of p-type and n-type microcrystalline semiconductor films is not higher than 50 nm.

36. The photoelectric conversion device of claim 35 wherein said metal element is one or a plurality of elements selected from the group of Fe, Co, Ni, Ru, Rh, Pd, Os, Ir, Pt, Cu and Au.

37. The photoelectric conversion device of claim 35 wherein said concentration is not lower than $5 \times 10^{16}$ cm$^{-3}$.

38. The photoelectric conversion device of claim 35 wherein said p-type and n-type microcrystalline semiconductor films exhibit a Raman spectrum which has two peaks at 520 cm$^{-1}$ and 480 cm$^{-1}$.

39. A semiconductor device comprising:

a microcrystalline semiconductor film formed on an amorphous semiconductor film and containing a metal element, wherein said metal element is one or a plurality of elements selected from the group of Fe, Co, Ni, Ru, Rh, Pd, Os, Ir, Pt, Cu and Au.

40. The semiconductor device of claim 39 wherein said metal element has a concentration not higher than $5 \times 10^{19}$ cm$^{-3}$.

41. The semiconductor device of claim 39 wherein said microcrystalline semiconductor film exhibits a Raman spectrum which has two peaks at 520 cm$^{-1}$ and 480 cm$^{-1}$.

42. A thin film transistor comprising:

a channel region comprising an amorphous semiconductor film;

source and drain regions comprising a microcrystalline semiconductor film, said microcrystalline semiconductor film containing a metal element, wherein said source and drain regions have p-type or n-type conductivity and are in contact with said channel region directly and wherein said metal element is one or a plurality of elements selected from the group of Fe, Co, Ni, Ru, Rh, Pd, Os, Ir, Pt, Cu and Au.

43. The thin film transistor of claim 42 wherein said metal element has a concentration not higher than $5 \times 10^{19}$ cm$^{-3}$.

44. The thin film transistor of claim 42 wherein said microcrystalline semiconductor film exhibits a Raman spectrum which has two peaks at 520 cm$^{-1}$ and 480 cm$^{-1}$.

45. The thin film transistor of claim 42 wherein said thin film transistor is a top-gate type thin film transistor.

46. The thin film transistor of claim 42 wherein said thin film transistor is a bottom-gate type thin film transistor.

47. A photoelectric conversion device comprising:

a semiconductor laminate film formed on a substrate having a conductive surface, said semiconductor laminate film comprising a p-type microcrystalline semiconductor film, an I-type amorphous semiconductor film and an n-type microcrystalline semiconductor film collectively defining a PIN-junction, wherein said p-type or n-type microcrystalline semiconductor films contain a metal element, wherein said metal element is one or a plurality of elements selected from the group of Fe, Co, Ni, Ru, Rh, Pd, Os, Ir, Pt, Cu and Au, and wherein said p-type and n-type microcrystalline semiconductor films are in contact with said I-type microcrystalline semiconductor film directly.

48. The photoelectric conversion device of claim 47 wherein said p-type and n-type microcrystalline semiconductor film have a concentration not higher than $5 \times 10^{19}$ cm$^{-3}$.

49. The photoelectric conversion device of claim 47 wherein said p-type and n-type microcrystalline semiconductor films exhibit a Raman spectrum which has two peaks at 520 cm$^{-1}$ and 480 cm$^{-1}$.

* * * * *